(12) United States Patent
Dierickx et al.

(10) Patent No.: US 9,699,398 B2
(45) Date of Patent: Jul. 4, 2017

(54) PIXEL WITH INCREASED CHARGE STORAGE

(71) Applicant: Caeleste CVBA, Mechelen (BE)

(72) Inventors: Bart Dierickx, Edegem (BE); Gaozhan Cai, Antwerpen (BE)

(73) Assignee: CAELESTE CVBA, Mechelen (BE)

( * ) Notice: Subject to any disclaimer, the term of this patent is extended or adjusted under 35 U.S.C. 154(b) by 187 days.

(21) Appl. No.: 14/688,020

(22) Filed: Apr. 16, 2015

(65) Prior Publication Data
US 2016/0307947 A1 Oct. 20, 2016

(51) Int. Cl.
H01L 27/16 (2006.01)
H04N 5/378 (2011.01)
H01L 27/146 (2006.01)
H04N 5/355 (2011.01)
H04N 5/3745 (2011.01)

(52) U.S. Cl.
CPC ......... H04N 5/378 (2013.01); H01L 27/1461 (2013.01); H01L 27/14605 (2013.01); H01L 27/14614 (2013.01); H01L 27/14616 (2013.01); H01L 27/14643 (2013.01); H04N 5/3559 (2013.01); H04N 5/37452 (2013.01)

(58) Field of Classification Search
CPC ......... H01L 27/14609; H01L 27/14643; H01L 27/14605; H01L 27/14614; H04N 5/378

USPC .................................................... 250/208.1
See application file for complete search history.

(56) References Cited

U.S. PATENT DOCUMENTS

| | | | | |
|---|---|---|---|---|
| 5,464,984 | A * | 11/1995 | Cox | G01T 1/2018 250/366 |
| 8,792,087 | B2 * | 7/2014 | Spickermann | G01S 7/4863 356/5.01 |
| 9,490,373 | B2 * | 11/2016 | Sakano | H01L 31/0216 |
| 2009/0045319 | A1 | 2/2009 | Sugawa et al. | |
| 2011/0037969 | A1 * | 2/2011 | Spickermann | G01S 7/4863 356/5.01 |

OTHER PUBLICATIONS

Dupont, "Three Level Transfer Gate," U.S. Appl. No. 14/554,327, filed Nov. 26, 2014.

* cited by examiner

*Primary Examiner* — Seung C Sohn
(74) *Attorney, Agent, or Firm* — Workman Nydegger

(57) ABSTRACT

A pixel circuit comprising a photodiode, a floating diffusion, a transfer gate for electrically connecting the photodiode to the floating diffusion, and a charge storage device, wherein the charge storage device comprises an electrode which is at least partly overlaying the photodiode, and which is configured and adapted to be driven so as to influence the total capacitance of the pixel.

2 Claims, 8 Drawing Sheets

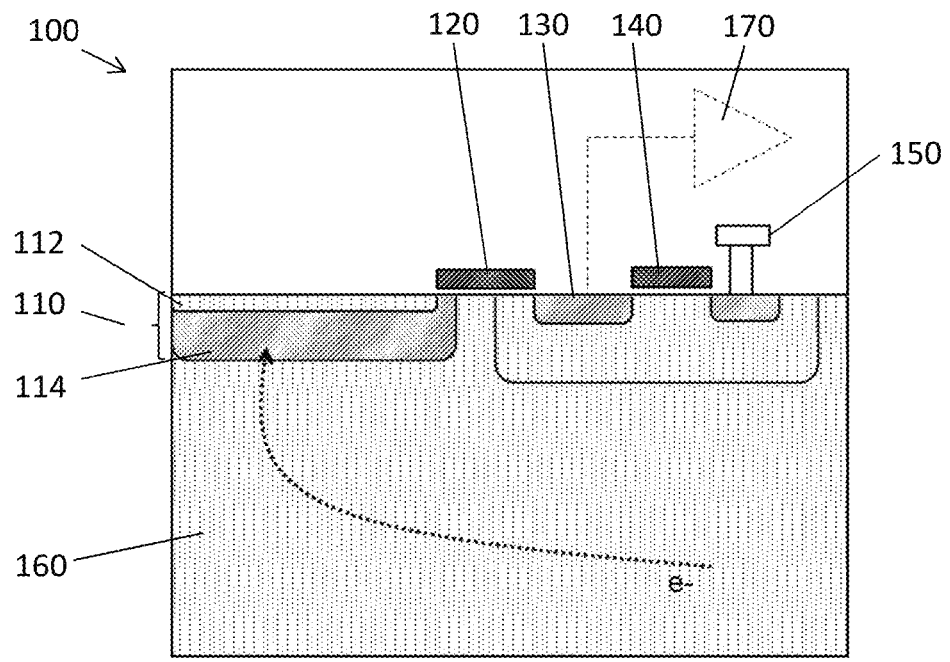
FIG. 1 – PRIOR ART
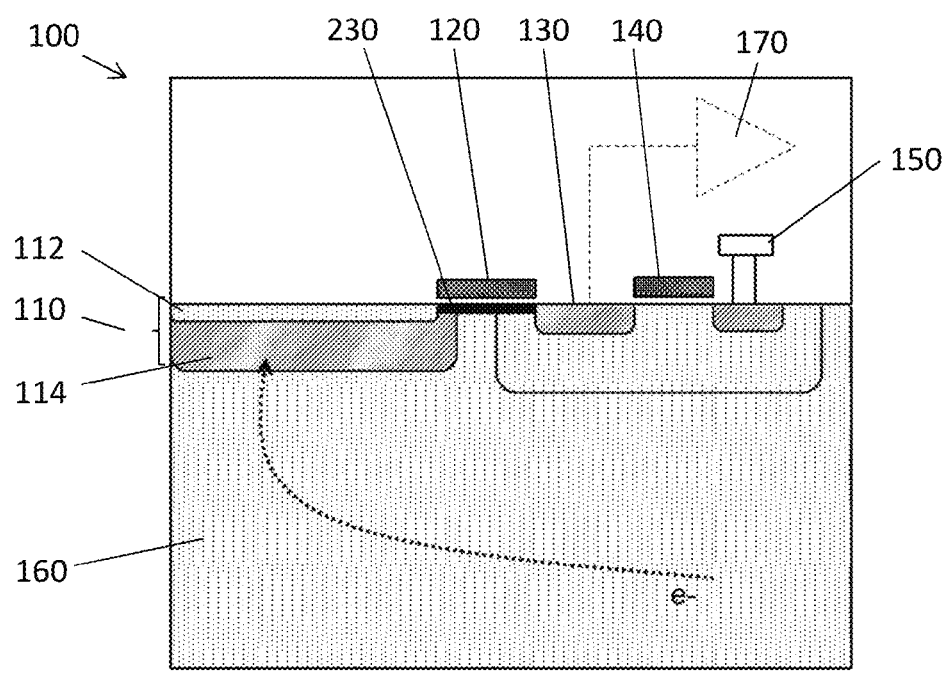
FIG. 2

PIXEL WITH INCREASED CHARGE STORAGE

FIELD OF THE INVENTION

The present invention relates to the field of image sensors. More specifically it relates to image sensors used in high illumination, low contrast scenes.

BACKGROUND OF THE INVENTION

A high illumination, low contrast scene is for example occurring when an airplane is landing in the mist. In such a scene the illumination level of a pixel of an image sensor is high and therefore the charge storage requirements of such a pixel are high. However, the same sensor may be used in a low-light situation, where the charge storage requirements are low. Thus pixels with a high dynamic range are required.

FIG. 1 shows a schematic cross-section of a prior art 4T pixel. The illustrated pixel 100 comprises a pinned photodiode 110, a transfer gate 120, a floating diffusion 130 and a reset gate 140. The dynamic range of the 4T pixel is thereby dependent on the storage capacity of the floating diffusion.

In order to increase the storage capacitance of optical sensors, Sugawa proposes in US 2009/0045319 to configure these optical sensors such that photocharges, overflowing from the photodiode, are stored in a plurality of storage capacitance elements. Thereby an optical device can be obtained which maintains a high sensitivity and a high S/N ratio and has a wide dynamic range. Yet these capacitors consume area and thus reduce the fill factor and/or increase the pixel size.

SUMMARY OF THE INVENTION

It is an object of embodiments of the present invention to provide pixels with increased charge storage capabilities and methods for operating these pixels in order to achieve pixels with a high dynamic range, without significantly increasing the pixels size nor reducing the fill factor.

The above objective is accomplished by a method and device according to embodiments of the present invention.

In a first aspect, the present invention provides a pixel circuit comprising a photodiode, a floating diffusion, a transfer gate for electrically connecting the photodiode to the floating diffusion, and a charge storage device. The charge storage device comprises an electrode which is at least partly overlaying the photodiode, and which is configured and adapted to be driven so as to influence the total capacitance of the floating diffusion.

It is an advantage of embodiments of the present invention that the charge storage capacity of the pixel may be increased without increasing the area of the pixel. The pixel size may for example be between 1 and 5 µm.

In a pixel circuit according to embodiments of the present invention, the electrode of the charge storage device may be positioned such that a direct transfer of charges in the charge storage device towards the floating diffusion is possible by enabling a connection between an inversion or accumulation layer under the electrode and the floating diffusion.

It is an advantage of embodiments of the present invention that no extra transfer gate is required for transferring the charges in the charge storage device towards the floating diffusion. It is an advantage that pixels according to embodiments of the present invention can be operated both at a low sensitivity but with a high charge storage capacity, as well as at a high sensitivity with a low charge storage capacity. It is an advantage of embodiments of the present invention that these different operating modes result in a programmable full well (charge storage capacity QFW) ranging between 10 k electrons and 1 M electrons or even beyond. At high illumination the photon shot noise is the dominating noise factor. It is an advantage of embodiments of the present invention that this noise factor can be limited by increasing the charge storage capacity (QFW). By limiting the photon shot noise the noise equivalent contrast is improved (NEC). It is an advantage of embodiments of the present invention that the contrast can be increased in low contrast scenes such as fog or haze.

In a pixel circuit according to embodiments of the present invention, the photodiode may be a pinned photodiode. It is an advantage of embodiments of the present invention that a low dark current can be obtained. In embodiments of the present invention charges in the charge storage device cannot transfer to the floating diffusion via the transfer gate because they are blocked by the pinning layer of the pinned photodiode. It is therefore an advantage of embodiments of the present invention that the charges in the charge storage device can directly transfer to the floating diffusion.

In embodiments of the present invention, the pinned photodiode may comprise a pinning layer and a buried layer, wherein the buried layer is fully or partly covered by the pinning layer.

In embodiments of the present invention, the charge storage device may be a metal oxide semiconductor capacitor between the electrode and a top implant of the photodiode. It is an advantage of embodiments of the present invention that standard metal oxide semiconductor (MOS) technology can be applied for obtaining the charge storage device. It is an advantage of embodiments of the present invention that the area of the pixel is not increased by adding the charge storage device.

In a pixel circuit according to embodiments of the present invention, the transfer gate is positioned such that an inversion layer (if the top implant is of n-type) or accumulation layer (if the top implant is of p-type) can be established between the photodiode and the floating diffusion when pulling the transfer gate high.

In a second aspect, the present invention provides a method for operating a pixel circuit according to embodiments of the first aspect of the present invention. Such pixel circuit comprises a photodiode, a floating diffusion, a transfer gate for electrically connecting the photodiode to the floating diffusion, and a charge storage device comprising an electrode which is at least partly overlaying the photodiode, and which is configured and adapted to be driven so as to influence the total capacitance of the floating diffusion. The method according to embodiments of the present invention comprises operating the pixel circuit using at least one of the following operating steps:

illuminating the pixel circuit while tying the transfer gate and the electrode low, and accumulating charges in the photodiode; or illuminating the pixel circuit while tying the transfer gate high or at an intermediate level and while tying the electrode low, and accumulating charges in the photodiode and the floating diffusion; or illuminating the pixel circuit while tying the transfer gate low or at an intermediate level and tying the electrode high or at an intermediate level, and accumulating charges in the charge storage device and the floating diffusion;

and reading out the accumulated charge by, pulsing the transfer gate thereby transferring the accumulated charge in the photodiode towards the floating diffusion and reading out charges present on the floating diffusion, and/or biasing the electrode such that charge accumulated in the charge storage device is transferred towards the floating diffusion and reading the floating diffusion.

Where in embodiments of the present invention reference is made to an "intermediate level", reference is made to a level between the low and the high level.

It is an advantage of methods according to embodiments of the present invention that the pixel circuit can be operated in different operating modes: in an operating mode with a high sensitivity and a low charge storage capacity, as well as in an operating mode with a low sensitivity and a high charge storage capacity, as well as in operating modes with an intermediate charge storage capacity. It is an advantage of embodiments of the present invention that no transfer gate is required for charging or discharging the charge storage device. It is an advantage of embodiments of the present invention that the charge storage capacity of the pixel is variable by tuning the intermediate levels to which the transfer gate and the electrode are tied. This allows to have a high gain range of the pixel when it is used without the extra charge storage and a low gain range when using the extra charge storage. In the last case a high signal, hence a high signal to noise ratio (SNR) or noise equivalent contrast (NEC) can be obtained.

A method according to embodiments of the present invention may comprise the following steps, in any suitable sequence:

a step of resetting the floating diffusion, a step of reading out the floating diffusion for obtaining a background level, a step, which may for example be happening before or in parallel to the steps previously mentioned, of illuminating the pixel circuit while the electrode is tied low and while the transfer gate is tied low, thus storing charges in the photodiode, a step of pulsing the transfer gate for transferring charges from the photodiode to the floating diffusion, then reading out the floating diffusion, a step of comparing the result of the pulsing step with the background level, a step of illuminating the pixel circuit while the transfer gate is tied low or intermediate and the electrode is tied high, thus storing charges in the charge storage device and overflowing these to the floating diffusion, and a step of reading out the floating diffusion.

It is an advantage of embodiments of the present invention that both high as well as low illumination can be read out by the same pixel and that hence a high dynamic range can be achieved, whereby the factor of high and low illuminations can differ by a factor of 2 to more than 20.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1 shows a schematic cross-section of a prior art 4T pixel.

FIG. 2 shows a schematic cross-section of a prior art 4T pixel whereby the transfer gate is tied high.

Figure 3:
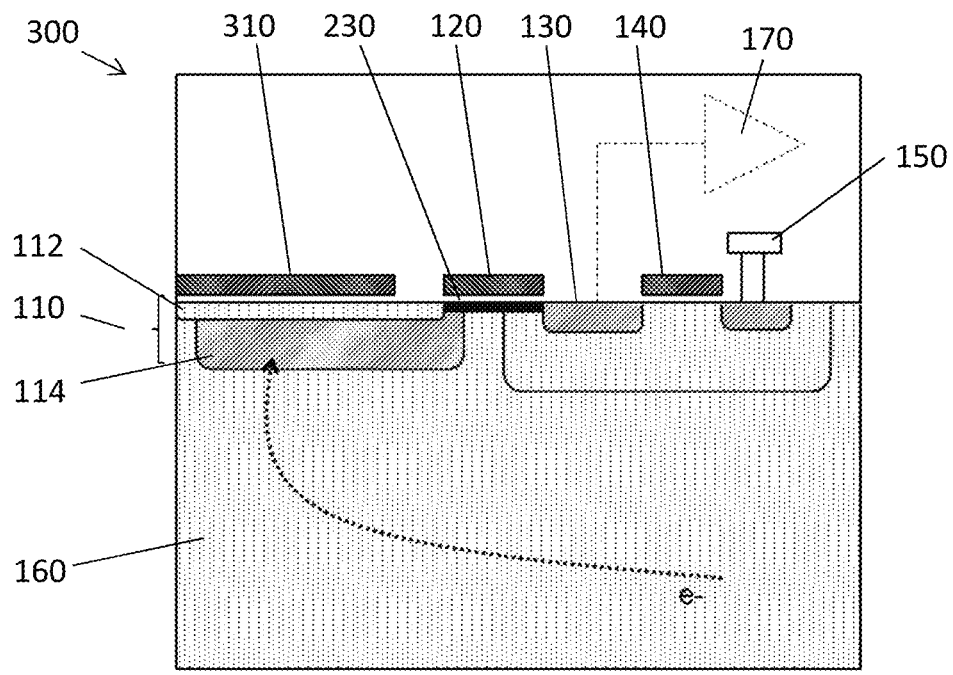
FIG. 3 shows a schematic cross-section of a pixel comprising an electrode and a pinning implant in an operation mode whereby the transfer gate is tied high in accordance with embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is to be understood that embodiments of the invention may be practiced without these specific details. In other instances, well-known methods, structures and techniques have not been shown in detail in order not to obscure an understanding of this description.

Where in embodiments of the present invention reference is made to the "top implant" of the photodiode, reference is made to the doped region of, or on top of, the photodiode which is the closest to the surface of the pixel (i.e. the doped region of, or on top of, the photodiode which is the furthest away from the substrate). A capacitor may be formed by applying an electrode and by applying an insulator layer between the electrode and the said top implant.

Where in embodiments of the present invention reference is made to "a charge storage device", reference is made to a means for storing an excess of charges collected by the photodiode.

Where in embodiments of the present invention reference is made to a gate or an electrode being "tied high", reference is made to such elements being driven by a voltage at least higher than the voltage in the semiconductor material, e.g. silicon, below the gate or electrode, plus a threshold voltage. For an nMOSFET such high voltage at the gate is typically in the range 2 to 4 V, meaning that the nMOSFET is "on" or in "strong inversion".

Where in embodiments of the present invention reference is made to a gate or an electrode being "tied low", reference is made to such elements being driven by a voltage lower than the threshold voltage, which is typically zero or even slightly negative.

FIG. 1 shows a schematic cross-section of a prior art 4T pixel 100 comprising a pinned photodiode 110 for collecting charge carriers, a floating diffusion 130 for storing collected charge carriers, a transfer gate 120 between the photodiode 110 and the floating diffusion 130 for transferring charge carriers from the photodiode to 110 the floating diffusion 130, a power supply VDDpix 150, and a reset gate 140 between the floating diffusion 130 and the power supply 150, for resetting the floating diffusion 130. The pinned photodiode 110 comprises a pinning layer 112 on top of a N-type buried layer 114 in a P-type substrate 160. Photons of sufficient energy which impinge onto the substrate 160, create electron-hole pairs. The electrons are attracted towards the PN junction between the buried layer 114 and the substrate 160, and are collected by the pinned photodiode 110 (see also the arrow annotated with e– in FIG. 1), and then transferred over the transfer gate 120 to the floating diffusion 130. The maximum charge that can be collected in typical pixels by the floating diffusion 130 (i.e. of a full well, $Q_{FW}$) is in the order of 10000 e– and is dominated by the parasitic capacitances of the floating diffusion node 130. A floating diffusion capacitance $C_{FD}$ of 1.5 fF results in a $Q_{FW}$ of about 10000 e–. The floating diffusion capacitance $C_{FD}$ is the total capacitance for the floating diffusion node 130, including the parasitic capacitances. The charge on the floating diffusion 130 is sensed, under the form of a floating diffusion voltage, by an in-pixel source follower 170 for readout. In this example of a 4T pixel the transfer gate 120 does not add to the capacitance of the floating diffusion 130 as the transfer gate 120 is switched off when the floating diffusion 130 signals are read out.

When tying the transfer gate 120 permanently high, the gate capacitance of the transfer gate 120 adds to the total capacitance of the floating diffusion 130. When tying the transfer gate 120 permanently high, there is a permanent inversion layer 230 under the transfer gate 120 that is electrically shunted to the floating diffusion 130 as is illustrated in FIG. 2. The pinned photodiode is thus also permanently shunted to the floating diffusion 130, and charges can permanently flow, over the transfer gate 120, from the photodiode 110 to the floating diffusion 130. In this case the operation of the 4T pixel 100 becomes the same as the operation of a prior art 3T-pixel.

When for example the prior art 4T pixel 100, as illustrated in FIG. 2, is operated in its 4T operation and has a floating diffusion capacitance of 2 fF, this corresponds with a $Q_{FW}$ of about 12000 e– at 1V. Tying the transfer gate 120 high, as in FIG. 2, and operating the same pixel as a 3T pixel as described above results in a floating diffusion capacitance additionally including the capacitance $C_{TG}$ of the transfer gate of for instance 10 fF. This results in that a total $Q_{FW}$ of 72000 e– at 1V can be obtained. The contribution of the capacitance $C_{PD}$ of the pinned photodiode 110 to the charge of the full well $Q_{FW}$ is negligible as the capacitance of the pinned photodiode is close to zero when its potential is above the depletion potential.

In a first aspect the present invention relates to a pixel circuit comprising a charge storage device, a photodiode and a floating diffusion. The charge storage device comprises an electrode which is, at least partly, overlaying the photodiode. The electrode 310 is configured, e.g. shaped and positioned, and may be driven so as to influence the total capacitance of the pixel. In particular the electrode 310 may be tied high to increase the total capacitance of the pixel. Suitable driving means may be provided, for instance for bringing the electrode 310 to a high or a low potential (=voltage), depending on the needs of the application. The total capacitance of the pixel is programmable, in the sense that it can be varied so as to take on different values, by suitably driving the electrode 310. In particular embodiments, the electrode 310 may be positioned such that, when the electrode is tied high, a direct transfer of charges from the charge storage device towards the floating diffusion is possible. The advantage thereof will become clear in view of the prior art 4T pixel of FIG. 1 and the prior art 4T pixel operated as a 3T pixel shown in FIG. 2, which are both described above.

Figure 4:
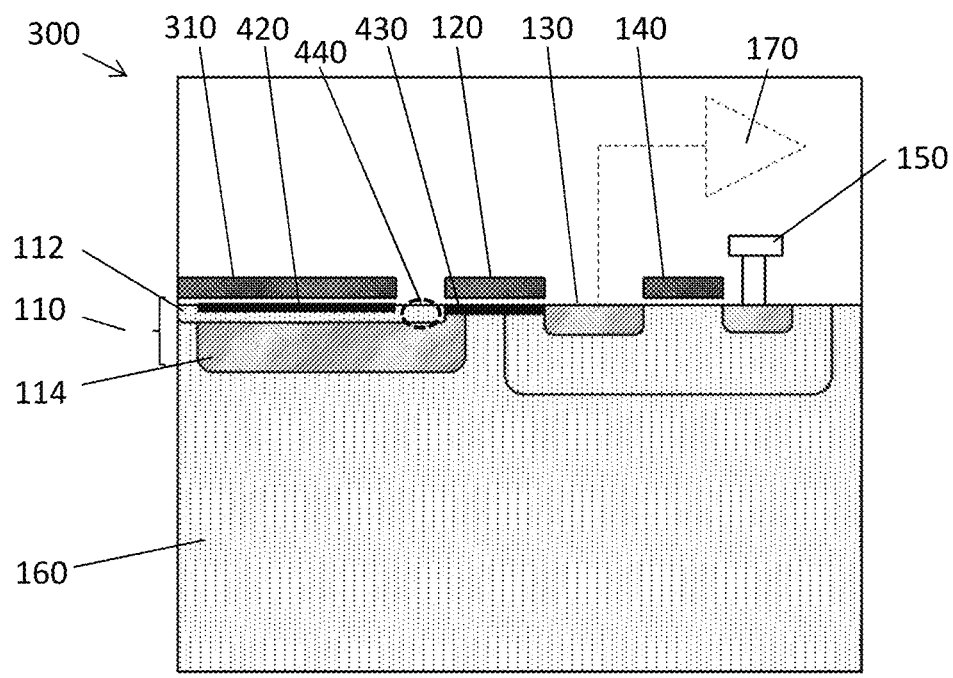
FIG. 4 shows a schematic cross-section of a pixel in an operation mode whereby the transfer gate as well as the electrode are tied high in accordance with embodiments of the present invention.

FIG. 3 and FIG. 4 show a cross-section of a pixel 300 in accordance with an embodiment of the present invention, in two different modes of operation. The pixel 300 comprises a pinned photodiode 110 for collecting charge carriers, a floating diffusion 130 for storing collected charge carriers, a transfer gate 120 between the photodiode 110 and the floating diffusion 130 for transferring charge carriers from the photodiode to 110 the floating diffusion 130, a power supply VDDpix 150, and a reset gate 140 between the floating diffusion 130 and the power supply 150, for resetting the floating diffusion 130. The pinned photodiode 110 comprises a pinning layer 112 on top of a N-type buried layer 114 in a P-type substrate 160.

According to embodiments of the present invention, a charge storage device is provided, which is partly overlaying the pinned photodiode 110. In this example the charge storage device is formed by adding a separate gate, formed by an electrode 310, on top of and partially covering the pinned photodiode 110, in particular on top of and partially covering the pinning layer 112 of the pinned photodiode 110. The electrode 310 is thereby galvanically separated from the pinned photodiode 110, for instance by providing a dielectric layer between the photodiode 110 and the electrode 310. In these embodiments of the present invention, the electrode 310 serves as a MOS capacitor on top of the pinned photodiode 110. The electrode 310 does not physically touch the transfer gate 120. The electrode 310 is made of any suitable conductive material, for instance polysilicon or metal. In case the pixel circuit according to embodiments of the present invention is to be used for front side illumination, the charge storage device, in particular the electrode 310 thereof, should preferably be made of or at least comprise optically transparent material, such that the charge storage device does not substantially block, preferably does not at all block, the impinging light towards the photodiode 110. In such case the electrode 310 may for example be made of a thin layer of polysilicon, a transparent conductive oxide layer such as for instance Indium Tin Oxide (ITO), fluorine doped tin oxide (FTO) or doped zinc oxide, or any other suitable transparent electrode material. For particular applications, carbon nanotube networks or graphene may for instance be used as electrode material, which can be made to be highly transparent to infrared light.

The total capacitance of the pixel circuit 300 can now be drastically changed depending on the operation mode. In 4T operation (not illustrated in the drawings, as obvious from prior art), hence when the transfer gate 120 is only actuated, i.e. put high, during transfer of charges from the photodiode 110 to the floating diffusion 130, with the electrode 310 tied low, the capacitance of the floating diffusion is, for this example for instance, 2 fF, corresponding with a $Q_{FW}$ of 12000 e– at 1V. In 3T operation, when the transfer gate 120 is high during the light integration and consequently also during read-out, and with the electrode 310 tied low, as illustrated in FIG. 3, the capacitance of the transfer gate 120 (e.g. 10 fF) adds to the total floating diffusion capacitance, thus, for this example, resulting in a total capacitance of 12 fF corresponding with a $Q_{FW}$ of 72000 e– at 1V. When in 3T operation (the transfer gate 120 is tied high) also the electrode 310 is tied high, as illustrated in FIG. 4, a layer of electrons 420 (inversion layer under the electrode 310) and a layer of electrons 430 (inversion layer under the transfer gate 120) are formed. The layer of electrons 430 is in contact with the floating diffusion, as can be seen in FIG. 4. But also, in embodiments of the present invention, the layer 420 of electrons is in contact with the floating diffusion 130. This is not shown in the cross-section of FIG. 4, but becomes obvious in the top view of FIG. 8, via path 820. The electrode 310 will thus increase the effective capacitance of the floating diffusion 130. The capacitance of the floating diffusion 130 increases with the gate capacitance formed by the electrode 310. This capacitance, e.g. 50 fF, is added to the total capacitance of the floating diffusion, thus resulting in a $Q_{FW}$ of about 400 ke– at 1V. It is therefore an advantage of embodiments of the present invention that the capacitance of the floating diffusion can be increased without proportionally increasing the pixel size. Hence, in embodiments of the present invention, the capacitance of the floating diffusion may be programmable, triggered by the way of operation of the pixel 300.

The doping level of the pinning layer 112 of the pinned photodiode 110 should be selected such that it is not so strongly doped that a MOS capacitor operation is prevented when the electrode is biased high. The doping of the pinning layer 112 may be in the order of $1E16/cm^3$ and $1E17/cm^3$, preferably with such p-type concentration that the threshold voltage of the electrode to this layer in on the order of 0.5 to 2V.

In case of a pinned photo diode 110, the MOS capacitor is formed between the electrode 310 and the P-type pinning layer 112. In alternative embodiments of the present invention, as explained below with respect to other embodiments, the charge storage device may be a MOS capacitor between an electrode 310 and the photo diode 110 itself.

When increasing the illumination of a pixel (high illumination applications), the photon shot noise (PSN) becomes the dominating noise source in the pixel.

The photon shot noise equals:

$$PSN[e_{RMS}^-] = SQRT(S[e_{RMS}^-])$$

whereby S is the signal of the pixel. The signal to noise ratio at high signal levels where the photon shot noise is the dominant noise therefore equals:

$$\frac{S}{N} \cong \frac{S}{PSN} = SQRT(S)$$

The best signal to noise ratio is therefore obtained at the highest signal. Hence the pixel can be designed such that the maximum charge of the full well $Q_{FW}$ can be as large as required by the expected illumination levels. It is thereby an advantage of embodiments of the present invention that the $Q_{FW}$ can be adapted, by selecting different modes of operation, depending on the illumination circumstances. An improved signal to noise ratio results in an improved noise equivalent contrast (NEC) which is essential to enhance the contrast of the image in for example on-chip or off-chip post-processing. Embodiments of the present invention therefore enable enhancing the contrast in fog, haze, and other low-contrast scenes. Whereas in normal images a SNR of 1:100 is sufficient, low-contrast images require a very high SNR before enhancing the low-contrast images. For example if the SNR is 100:1, corresponding with a $Q_{FW}$ of 10000 electrons, an [image processing] numerical contrast enhancement with a factor 10 results in a decrease of the SNR to 10:1 which means that the noise becomes visible and disturbing to the human eye. Contrast enhancing an image with a SNR of 1000:1, corresponding with a $Q_{FW}$ of 1000000 electrons, with a factor 10 will result in a SNR of 100:1 which is still OK for the human eye. It is thus an advantage of embodiments of the present invention that a pixel with an increased maximum charge of the full well $Q_{FW}$ can be realized.

Figure 5:
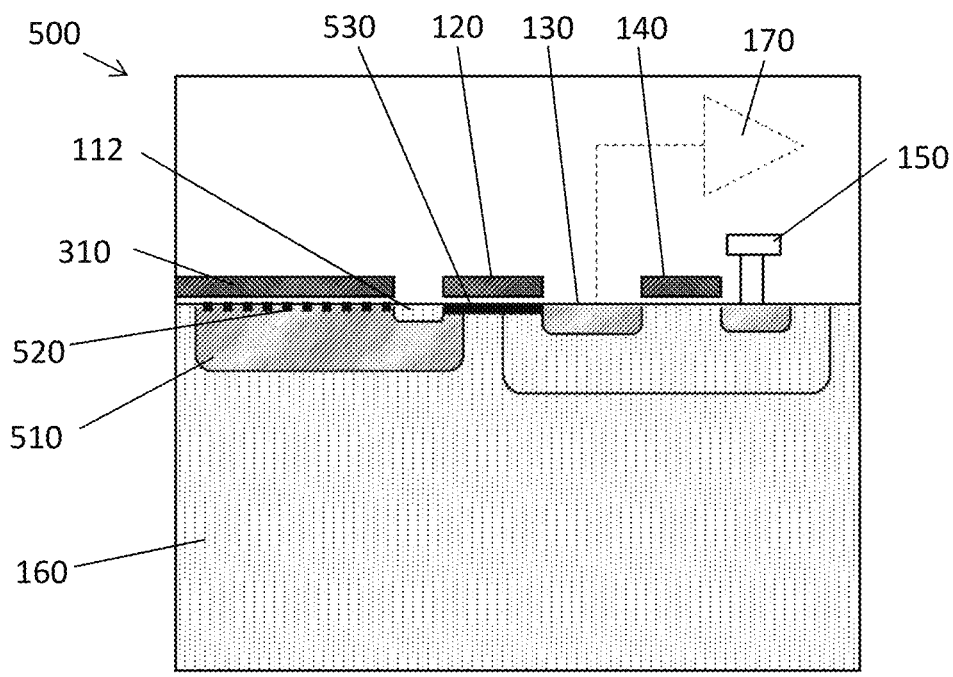
FIG. 5 shows a schematic cross-section of a pixel comprising an electrode and a reduced pinning implant in accordance with embodiments of the present invention.

FIG. 5 shows the cross-section of a pixel 500 in accordance with alternative embodiments of the present invention. The pixel 500 illustrated in FIG. 5 is similar to the pixel 300 illustrated in FIG. 3 and FIG. 4, and features which are similarly numbered have a same function. The main difference between the pixel 500 of FIG. 5 and the pixel 300 of FIG. 3 and FIG. 5 is that in the pixel 500 the photodiode does not comprises a pinning layer but only a buried diode 510. Hence, also this embodiment, an electrode 310 is provided which at least partly overlaps the photodiode formed by the buried diode 510, but no pinning layer is present between the buried diode 510 and the electrode 310. However, a galvanic separation, for instance under the form of a dielectric layer, is present in between them. In the implementation illustrated in FIG. 5, the electrode 310 is tied low, such that a layer 520 of holes (inversion layer versus the buried diode 510) is present underneath the electrode 310 at the surface of the buried diode 510. In the absence of a pinning layer between the electrode 310 and the buried diode 510, the electrode 310 should be biased low to prevent that the buried diode 510 touches the Si—SiO$_2$ via an inversion of accumulation layer, as this would deteriorate the dark current. In FIG. 5 the transfer gate 120 is tied high, resulting in a layer of electrons 430 (inversion layer versus substrate) underneath the transfer gate 120. The inversion layer is the bottom electrode of the MOS capacitance of the electrode 310.

Other embodiments of the present invention, not illustrated in the drawings, may have a pinning layer underneath only part of the electrode 310 and/or only partly covering the buried diode 510.

In embodiments of the present invention where a zone 440 of the pinning layer 112 is present between the layer of electrons 420 (inversion layer under the electrode 310) and the floating diffusion 130, as for instance illustrated in FIG. 4, the layer of electrons 420 cannot be transferred as such towards the floating diffusion 130 because of the presence of this zone 440 of the pinning layer 112. Therefore, in preferred embodiments of the present invention, the electrode 310 is positioned such that a direct transfer of charges from the charge storage device towards the floating diffusion is made possible. Hereto, the transfer gate 120 over the substrate between the photodiode 110 and the floating diffusion 130 and the electrode 310 are physically implemented as a single electrode 610. An example of such implementation is illustrated in FIG. 6, FIG. 7 and FIG. 8.

Figure 6:
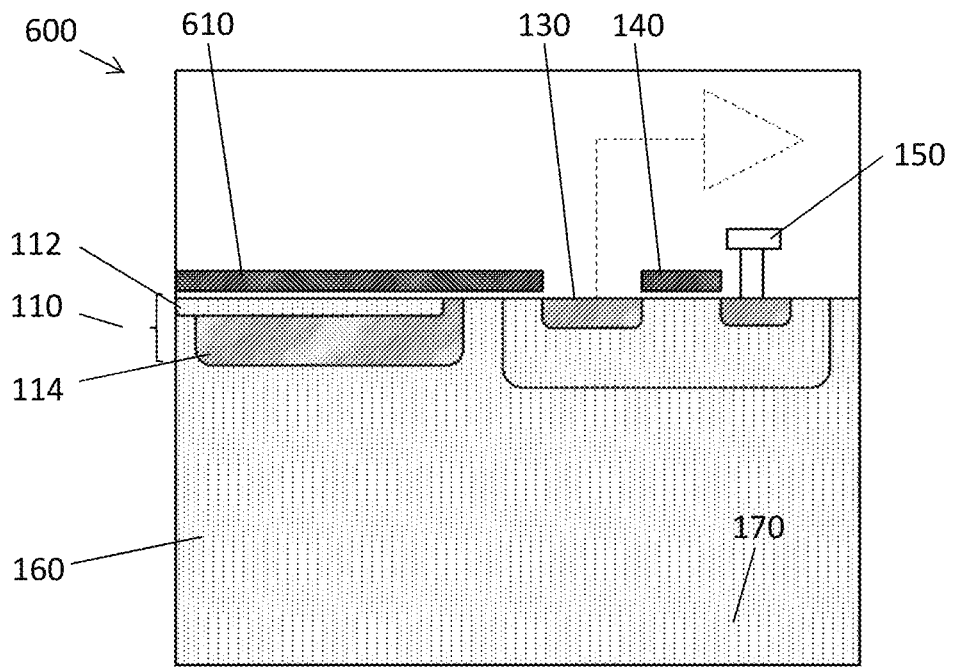
FIG. 6 shows a cross-section of a pixel comprising a parallel path towards the floating diffusion whereby the electrode is tied low in accordance with embodiments of the present invention.
Figure 7:
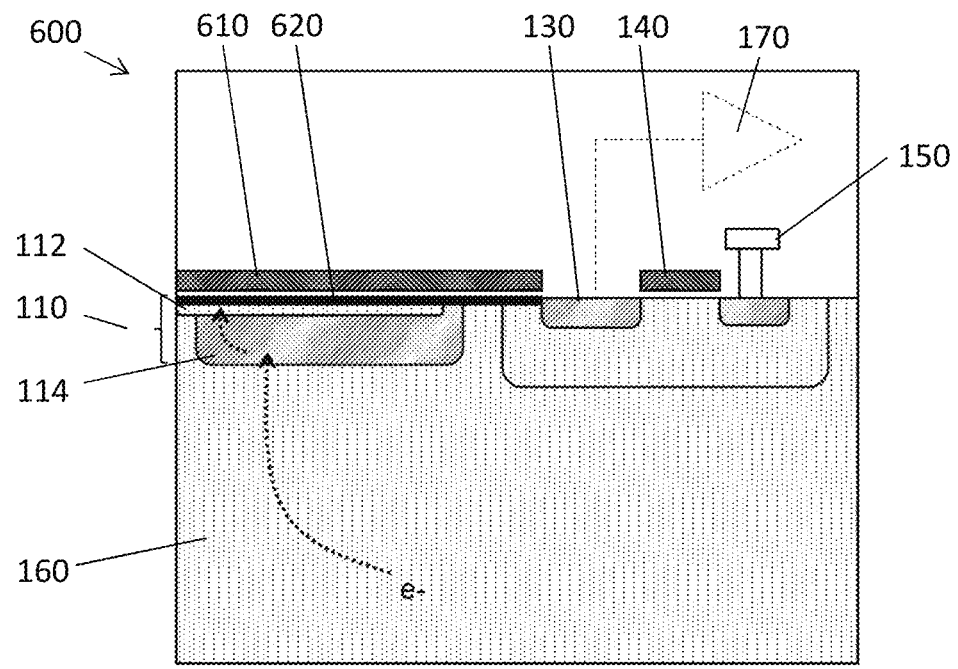
FIG. 7 shows a cross-section of a pixel comprising a parallel path towards the floating diffusion whereby the electrode is tied high in accordance with embodiments of the present invention.
Figure 8:
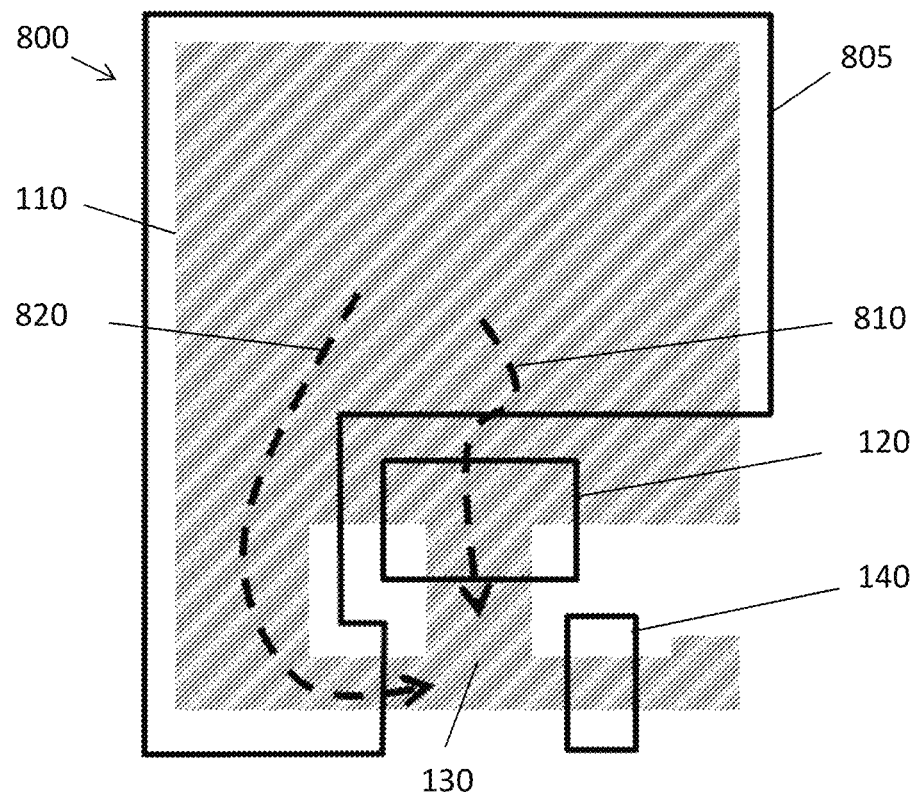
FIG. 8 shows the top view of a pixel comprising an electrode having a path via the transfer gate and a path via the electrode towards the floating diffusion in accordance with embodiments of the present invention.

FIG. 6 and FIG. 7 show a cross-section of a pixel 600 according to embodiments of the present invention, in two different modes of operation whereby the cross-section is taken such that a path for the charges in the charge storage device towards the floating diffusion 130 is visible. FIG. 6 illustrates the case where the electrode 610 is connected to a low signal, while FIG. 7 illustrates the case where the electrode 610 is connected to a high signal.

In the implementation illustrated in FIG. 6, no conduction path exists towards the floating diffusion 130. Also no layer of electrons underneath the electrode 610 is present.

In the implementation illustrated in FIG. 7, where the electrode 610 is tied to a high signal, impinging photons result in electrons which are collected in the buried layer 114 of the pinned photodiode 110. When the number of electrons in the buried layer 114 increases so much that they cannot be stored in the buried layer 114, or when the potential barrier to the inversion layer underneath the electrode 310 can be overcome, the electrons will go to that inversion layer and sit there as a layer 620 of electrons. The charge storage capacity in the inversion layer underneath the electrode 610 is much higher than the charge storage capacity in the buried layer 114 of the pinned photodiode 110. The charge storage capacity in the buried layer 114 of the pinned photodiode 110 is for example 2000 electrons/µm$^2$ whereas the inversion layer in a MOS structure has a typical capacity of 30000 electrons/µm$^2$.

In embodiments of the present invention, the charge may be stored in an accumulation layer or in an inversion layer underneath the electrode 310, depending on which underlying implant is considered (buried layer 410 or pinning layer 112). In the example illustrated in FIG. 7 a sheet layer of electrons 620 is stored in an inversion layer underneath the electrode 610.

In embodiments of the present invention the charge is entering the charge storage device (capacitor formed by the electrode 310 on top of the photodiode 110) either by:
  overflow through the PN junction,
  ohmic conduction when the bias voltage is sufficiently high,
  via the connection of the inversion/accumulation/electron layer 620 to the floating diffusion 130.

The layer underneath the electrode 610 may be referred to as an inversion layer when it is present on a P-doped background. When present on an N-doped background the layer underneath the electrode 610 may be referred to as an accumulation layer.

FIG. 8 is a top view of a pixel 800 in accordance with an embodiment of the present invention. The figure shows an electrode 805 and a pinned photodiode 110 whereby the electrode 805 overlays the pinned photodiode 110. FIG. 8 moreover shows a transfer gate 120 partly above the pinned photodiode 110 and oriented towards the floating diffusion 130 and a reset gate 140 between the floating diffusion 130 and a connection to a voltage supply. The electrode 310 is positioned such that the pixel 300 has two paths from the pinned photodiode 110 towards the floating diffusion 130.

A first path 810 is created via the transfer gate 120, whereby charge collected in the pinned photodiode 110 accumulates in the pinned photodiode and can be read out using a pulse on the transfer gate 120, preferably by using correlated double sampling (CDS). Thereby the voltage of the floating diffusion 130 may be measured twice: a first time after pulsing the reset gate 140 and a second time after pulsing the transfer gate 120. By comparing both measurements, reset noise can be eliminated.

A second path 820 goes from the photodiode 110 to the floating diffusion 130 via the electrode 805. Thereby the electrode 805 is positioned such that a parallel path, parallel with the path via the transfer gate 120, towards the floating diffusion 130 is possible. When the charge accumulated in the pinned photodiode 110 exceeds the charge storage capacity of the pinned photodiode 110, the charge will overflow the PN junction between the pinned photodiode's P and N layers, and integrate in the inversion layer present between the pinned photodiode 110 and the electrode 805. This charge is shared, simultaneously or later with the floating diffusion 130 via the second path 820. This charge can therefore be read out by the floating diffusion 130.

Where FIG. 8 is a top view of a pixel in accordance with embodiments of the present invention, FIG. 3 and FIG. 4 can be said to be a cross-sectional view along the first path 810, and FIG. 6 and FIG. 7 can be said to be a cross-sectional view along the second path 820.

It is an advantage of embodiments of the present invention that excess charge may overflow and can be stored in the inversion or accumulation layer between the electrode 805 and the photodiode 110, and can subsequently be read out by the floating diffusion 130, rather than that the charge would overflow to the substrate 160 which would create a blooming effect.

In embodiments of the present invention the extra charge may flow over the transfer gate 120 into the floating diffusion 130. This may be done for instance in a manner as described in U.S. Pat. No. 14/554,327, incorporated herein by reference. In this embodiment, the transfer gate is subsequently biased to at least three different bias voltages, of which at least OFF (no transfer of charges from the photodiode to the floating diffusion), ON (full transfer of charges from the photodiode to the floating diffusion) and an intermediate bias voltage with a value in the range between the OFF bias voltage and the ON bias voltage (partial transfer of overflow of charges from the photodiode to the floating diffusion) are used. This way, any possible overflow can be controlled by means of a single transistor by the selectable intermediate bias voltage, avoiding leakage of currents and related negative effects, while simultaneously collecting the overflown charges and enabling accounting for their influence.

In a second aspect, the present invention relates to a method for operating a pixel 300, 600, 800 according to embodiments of the present invention. In embodiments of the present invention the charge storage capacity of the charge storage device, and thus of the pixel in general, is tuned at readout time. In embodiments of the present invention the signals are even read out in high gain range and low gain range simultaneously, or quickly after one another. It is thereby an advantage that a high dynamic range signal can be obtained.

Figure 16:
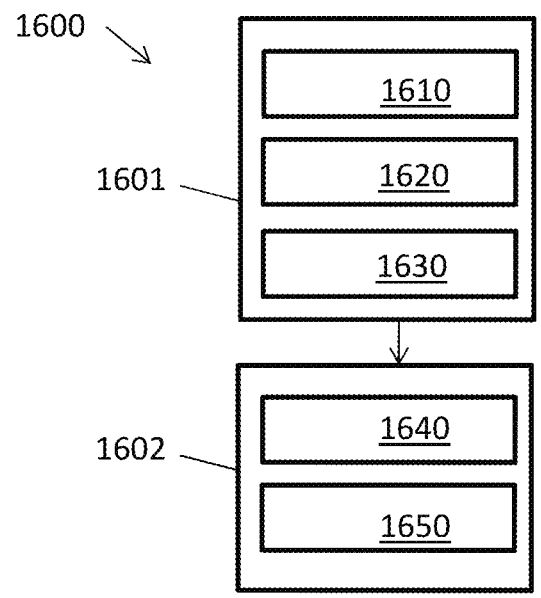
FIG. 16 and FIG. 17 show method steps in accordance with embodiments of the present invention for operating pixels in accordance with embodiments of the present invention.

FIG. 16 illustrates different steps of a method 1600 according to embodiments of the present invention for operating a pixel 300, 600, 800. The method 1600 comprises two parts, a first part 1601 related to illuminating of the pixel and accumulation of charge, and a second part 1602 related to read-out. The first part 1601 comprises different possible steps for operating the pixel 300, 600, 800 while illuminating it. These steps are:

Step 1610: illuminating the pixel circuit while tying the transfer gate 120 and the electrode 310, 610, 805 low. Charges may be collected only in the photodiode.

Step 1620: illuminating the pixel circuit while tying the transfer gate 120 high or at an intermediate level and while tying the electrode 310, 610, 805 low. Charges may be collected in the photodiode and may be stored there, or may overflow—depending on the level of the transfer gate biasing—to the floating diffusion 130.

Step 1630: illuminating the pixel circuit while tying the transfer gate 120 low and tying the electrode 310, 610, 805 high or at an intermediate level. Charges may be collected by the photodiode and if excess charges are present they may overflow to the inversion or accumulation region underneath the electrode 310, 610, 805.

The second part 1602 comprises different possible steps for reading out the accumulated charge. These are:

Step 1640: pulsing the transfer gate 120 thereby transferring the accumulated charge in the photodiode 110 towards the floating diffusion 130 for thereafter reading out the charges present in the floating diffusion.

Step 1650: biasing the electrode 310, 610, 805 such that charge accumulated in the charge storage device is transferred towards the floating diffusion 130 and reading the floating diffusion 130.

Figure 17:
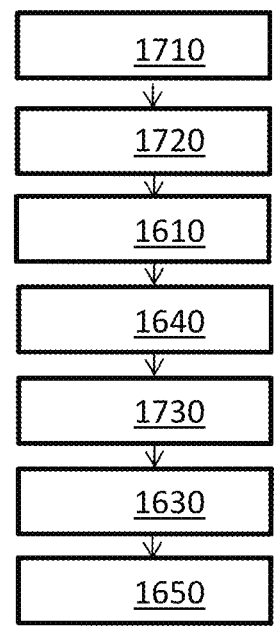

Particular embodiments of the present invention provide a high dynamic range operation (HDR), which may comprise the following steps, as illustrated in FIG. 17:

In a first step 1710, the floating diffusion 130 may be reset by conveniently pulsing the reset gate 140. Hereto, the reset gate is put high, so that the floating diffusion is connected to the power supply and is discharged, whereafter the reset gate is brought low again.

In a second step 1720 the floating diffusion voltage, after having been reset, is read out via the source follower, thus obtaining a background level of the pixel. In a third step 1610 the pixel 800 is illuminated while the electrode 805 is tied low, and while the transfer gate 120 is tied low. Charges are only stored in the photodiode.

In a fourth step 1640 the transfer gate 120 is pulsed whereby it goes from a tied low to a tied high and back again to the tied low state thereby transferring the accumulated charge in the photodiode towards the floating diffusion. The pulse period may be between 0.1 µs and 10 µs. After pulsing the transfer gate 120 and thus transferring the charges from the photodiode to the floating diffusion 130, the latter is read out.

The charge read out in the fourth step result is compared with the background level in a fifth step 1730. In case of low illumination, and hence low charge (not overflowing the buried layer 114 of the pinned photodiode), the by the pixel integrated charge is obtained in this step.

In case of high light levels, a further charge integration step 1630 takes place, whereby the electrode 805 is tied high and whereby the transfer gate 120 is tied low. The collected charge is in first instance stored in the photodiode, but if more charge is present than can be stored in the photodiode (high illumination levels), charge may overflow the barrier between the buried layer 114 of the pinned photodiode 110 to the inversion layer underneath the electrode 805, and this overflown charge is directly transferred to the floating diffusion 130.

The charge overflown to the floating diffusion 130 it is read therefrom during a further step 1650, after the integration time has elapsed. In case of high illumination, and hence high charge, the integrated charge is obtained in this step.

In embodiments of the present invention the electrode 805 and the transfer gate 120 may also be biased at intermediate levels. These operation modes according to embodiments of the present invention are illustrated in FIG. 9 to FIG. 13. In each of these figures the left figure corresponds with the situation at the first path 810 via the transfer gate 120 and the right figure corresponds with the situation at the second path 820 via the electrode 805.

Figure 9:
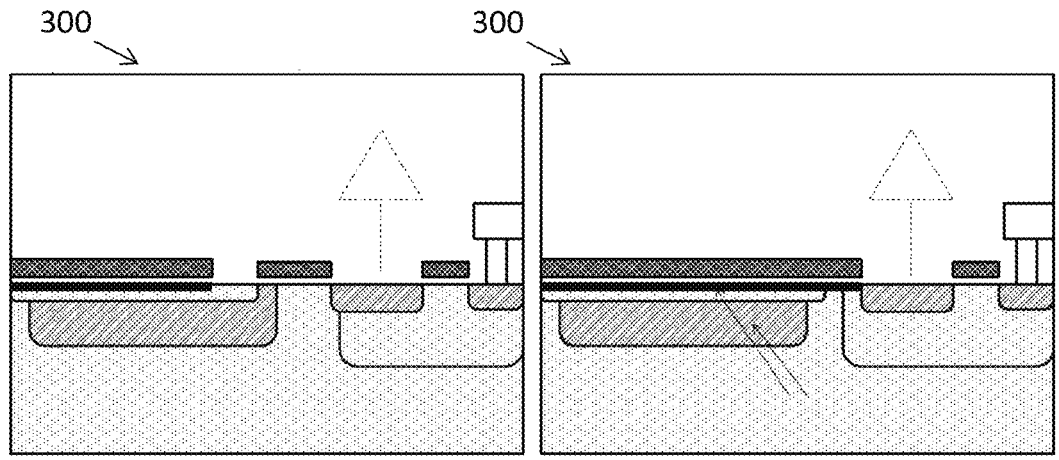
FIG. 9 shows two cross-sections, one showing the path via the transfer gate and one showing the path via the electrode, of the same pixel in accordance with embodiments of the present invention.

The left figure in FIG. 9 shows the cross-section of a pixel 800 whereby the cross-section is taken such that the first path 810 via the transfer gate 120 is shown. In this figure the electrode 310 is tied at an intermediate level. The right figure in FIG. 9 shows the cross-section of a pixel 800 whereby the cross-section is taken such that the second path 820 via the electrode 805 is shown. Also in this figure the electrode 805 is tied at an intermediate level.

Figure 10:
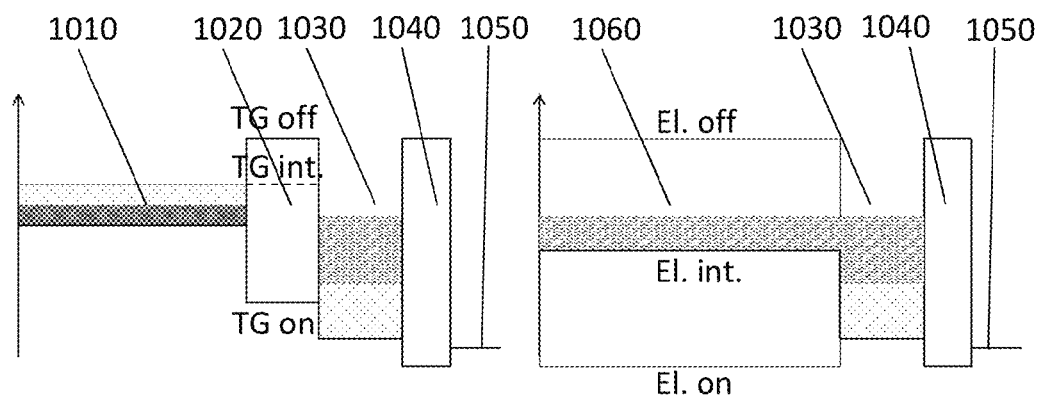
FIG. 10 shows the potential diagrams for both paths of a pixel in accordance with embodiments of the present invention, whereby the electrode and the transfer gate are tied to an intermediate level.

FIG. 10, FIG. 11, FIG. 12 and FIG. 13 show the potential diagrams for both paths 810, 820. The left diagrams show the potential diagrams of the first path 810 via the transfer gate 120. The right diagrams show the potential diagrams of the second path via the electrode 805. The accumulation of charges 1010 in the photodiode 110, the potential barrier 1020 of the transfer gate 120, the potential level 1030 in the floating diffusion 130, the reset barrier 1040 of the reset gate 140, and the VDDpix level 1050 are shown. Impinging photons on the pixel 800 result in charge accumulation in the photodiode 110 illustrated by the charge levels 1010 in the left graph of FIG. 10. The transfer gate 120 may be tied to an intermediate level 1020 (TG int.) between ON (tied high) and OFF (tied low). From this level extra charges which would be collected in the photodiode 110 overflow over the transfer gate 120 in the floating diffusion 130. The right graph of FIG. 10 shows the levels 1060, 1030 when the electrode 805 is tied at an intermediate level. When biasing the electrode 805 to an intermediate level ($V_{inter}$), the inversion layer 520 voltage is $V_{inter}$-$V_{th}$ (where $V_{th}$ is the threshold hold voltage of this MOS structure) or lower. It will not be shunted automatically to the floating diffusion 130 as long as the floating diffusion is at a higher voltage.

Figure 11:
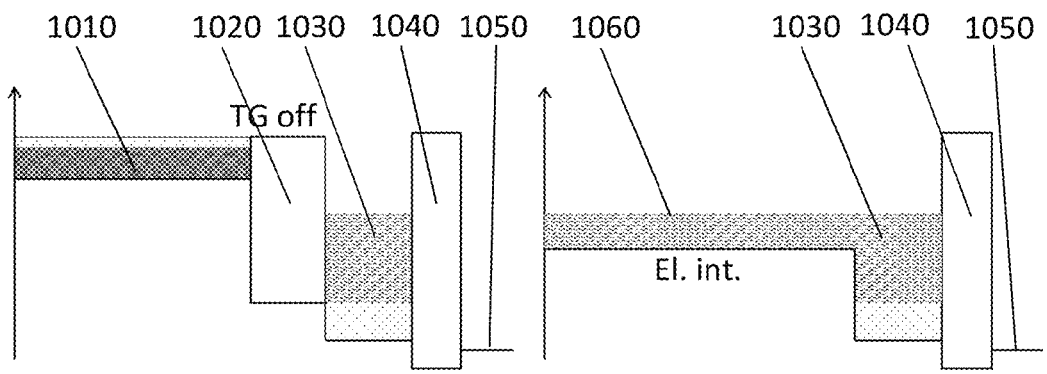
FIG. 11 shows the potential diagrams for both paths of a pixel in accordance with embodiments of the present invention, whereby the transfer gate is off and the electrode is tied to an intermediate level.

FIG. 11 shows potential diagrams when the transfer gate 120 is off and when the electrode 805 is tied to an intermediate level. In this mode charge is integrated in the photodiode. This operation mode can be applied in low illumination circumstances e.g. at night. In this mode the reset level of the floating diffusion can be measured (background measurement).

Figure 12:
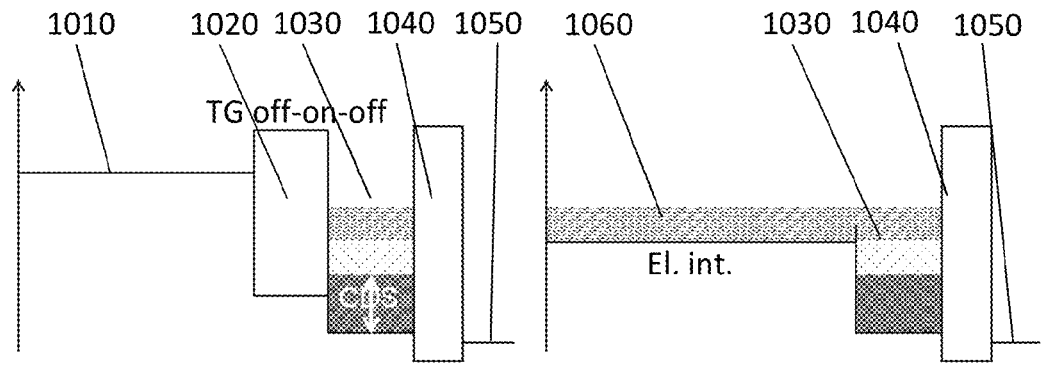
FIG. 12 shows the potential diagrams for both paths of a pixel in accordance with embodiments of the present invention, after off-on-off switching of the transfer gate whereby the electrode is tied to an intermediate level.

FIG. 12 shows the potential levels when the electrode 805 is tied to an intermediate level and after applying an off-on-off pulse to the transfer gate 120. The transfer gate is switched on by biasing the transfer gate 120 high to remove the potential barrier imposed by the transfer gate. When switching the transfer gate on, the charges accumulated in the photodiode 110 are transferred to the floating diffusion 130 region. After the off-on-off pulse of the transfer gate 120, the potential level 1030 in the floating diffusion 130 can be measured. Correlated double sampling can be obtained by comparing the measured signal level with the previously measured reset level (background measurement).

Figure 13:
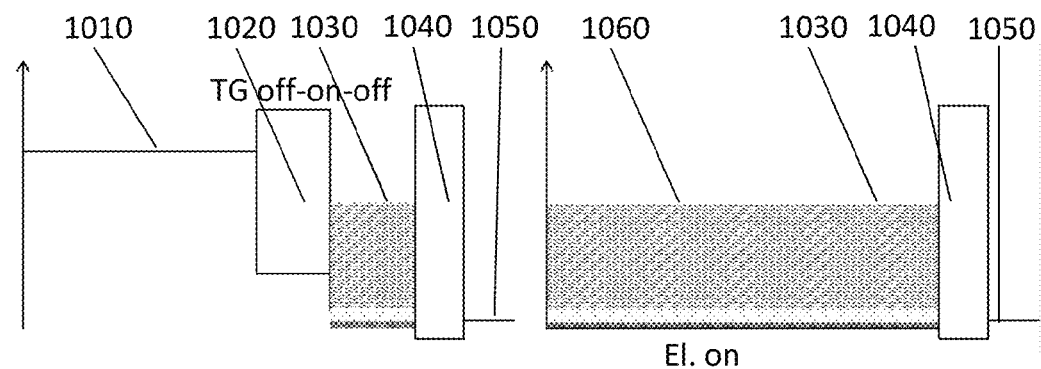
FIG. 13 shows the potential diagrams for both paths of a pixel in accordance with embodiments of the present invention, after off-on-off switching of the transfer gate whereby the electrode is tied to a high level.

FIG. 13 shows the levels when the electrode 805 is tied to a high level and after high illumination of the pixel 800 whereby charges are collected in the inversion layer 520 of the charge storage device. This operation mode can be applied in high illumination circumstances with low contrast, for example in the mist.

The noise performance of a pixel 800 according to embodiments of the present invention is depending on the operation mode of the pixel and is evaluated considering kTC noise and the photon shot noise (PSN). It is thereby an advantage of embodiments of the present invention that a pixel 800 according to embodiments of the present invention can be operated in different operation modes depending on the illumination requirements. The given numbers are exemplary and are not limiting the invention thereto.

When operating the pixel 800 in 4T mode (small $Q_{FW}$, high gain), the floating diffusion capacitance is 2 fF corresponding with a $Q_{FW}$ of 12000e−. The kTC noise is 20 $e_{RMS}^-$ but can be removed by correlated double sampling which is possible in the 4T operation mode. Thus, at small light strength, the noise level is smaller than the kTC noise due to the correlated double sampling operation. At higher light strength the photon shot noise is dominating. The signal to noise ratio (considering the photon shot noise) in case both signal and noise are taken at the same illumination level is equal to sqrt($Q_{FW}$/e−)=110:1. At a $Q_{FW}$ of 12000e− the pixel 800 quickly saturates in this operation mode. Therefore it is an advantage of embodiments of the present invention that the pixel 800 can be operated in the following additional operation modes.

When operating the pixel 800 in 3T operation mode with medium gain by biasing the transfer gate 120 high and biasing the electrode 805 low, the capacity of the transfer gate adds to the floating diffusion capacitance resulting in a capacitance of 10 fF corresponding with a $Q_{FW}$ of 72000e−. The kTC noise is in this case 50e−. The signal to noise ratio (considering the photon shot noise) in case both signal and noise are taken at the same illumination level is equal to sqrt($Q_{FW}$/e−)=250:1.

When operating the pixel 800 in 3T operation mode with low gain by biasing the transfer gate 120 high and biasing the electrode 805 high, also the charge storage in the electrode capacitor is used. The capacity of the electrode 805 capacitor thus adds to the total capacitance of the floating diffusion 130 (through the second path 820 towards the floating diffusion 130 via the electrode 310). This results in a floating diffusion capacitance of 50 fF corresponding with a $Q_{FW}$ of 400000e−. The kTC noise is in this case 100e−. Thus at small light strength the noise level is equal to the kTC noise which is higher than the correlated double sampling noise. At higher light strength the photon shot noise is dominating. The signal to noise ratio (considering the photon shot noise) in case both signal and noise are taken at the same illumination level is equal to sqrt($Q_{FW}$/e−)=650:1.

It is thus an advantage of embodiments of the present invention that the different operating modes according to embodiments of the present invention allow to operate the pixel in high gain mode as well as in low gain mode. Thereby the signal to noise ratio is increasing when decreasing the gain. Depending on the light intensity, a different operating mode can be selected. Operating modes can even be combined in order to obtain a high dynamic range.

Figure 14:
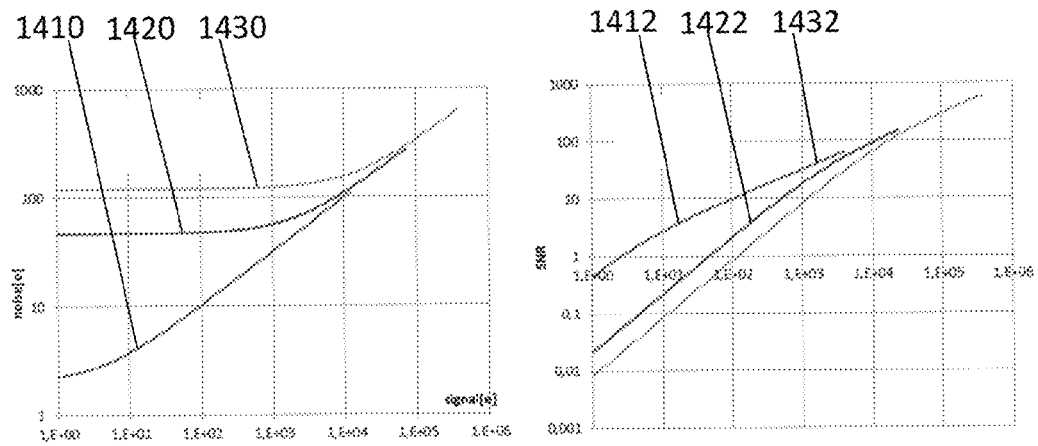
FIG. 14 and FIG. 15 shows signal levels and signal to noise ratios of measurements done with pixels in accordance with embodiments of the present invention.
Figure 15:
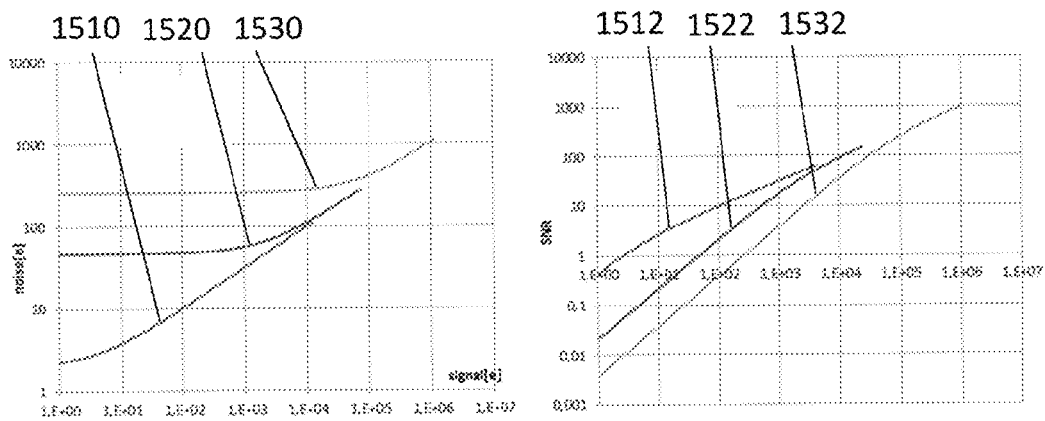

The noise and signal-to-noise ratio in function of the signal in the different operating modes of the pixel 800 according to embodiments of the present invention are illustrated in FIG. 14 and FIG. 15. The left graphs in FIG. 14 and FIG. 15 show the noise in function of the signal. Curves 1410 and 1510 are the noise levels when operating in 4T mode with a total floating diffusion capacitance of 2 fF. At small signal levels the noise is dominated by the correlated double sampling and at increasing signal levels the photon shot noise is dominating. Curves 1420 and 1520 are the noise levels when operating the pixel by biasing the transfer gate 120 high. The total floating diffusion capacitance corresponding with curves 1420 and 1520 is 12 fF. At low signal levels the kTC noise is dominating, at higher signal levels the photon shot noise is dominating. Curves 1430 and 1530 are the noise levels when operating the pixel by biasing the transfer gate 120 high and by biasing the electrode 310 high. The total floating diffusion capacitance corresponding with curve 1420 is 62 fF and with curve 1520 is 187 fF. At low signal levels the kTC noise is dominating, at higher signal levels the photon shot noise is dominating.

The signal to noise ratios of the same operating modes are illustrated in the right graphs of FIG. 14 and FIG. 15. Noise curve 1410 corresponds with signal to noise ratio 1412 and corresponds with a total floating diffusion capacitance of 2 fF. For the other curves the following relations can be made: 1420, 1422, 12 fF; 1430, 1432, 62 fF; 1510, 1512, 2 fF; 1520, 1522, 12 fF; 1530, 1532 187 fF. The signal-to-noise ratio illustrates that the saturation level is increasing with an increasing floating diffusion capacitance. At low signal levels, however, the signal-to-noise ratio is higher for operating modes with a smaller floating diffusion capacitance. It is therefore an advantage of embodiments of the present invention that the pixel 800 can be operated in different operating modes.

The invention claimed is:

1. A method for operating a pixel circuit comprising a photodiode, a floating diffusion, a transfer gate for electrically connecting the photodiode to the floating diffusion, and a charge storage device comprising an electrode which is at least partly overlaying the photodiode, and which is configured and adapted to be driven so as to influence the total capacitance of the floating diffusion, the method comprising operating the pixel circuit using at least one of the following operating steps:

illuminating the pixel circuit while tying the transfer gate and the electrode low, and accumulating charges in the photodiode; or illuminating the pixel circuit while tying the transfer gate high or at an intermediate level and while tying the electrode low, and accumulating charges in the photodiode and the floating diffusion; or illuminating the pixel circuit while tying the transfer gate low or at an intermediate level and tying the electrode high or at an intermediate level, and accumulating charges in the charge storage device and the floating diffusion; and reading out the accumulated charge by, pulsing the transfer gate thereby transferring the accumulated charge in the photodiode towards the floating diffusion and reading out charges present on the floating diffusion, and/or biasing the electrode such that charge accumulated in the charge storage device is transferred towards the floating diffusion and reading the floating diffusion.

2. A method according to claim 1, the method comprising the following steps:

a step of resetting the floating diffusion, a step of reading out the floating diffusion for obtaining a background level, a step of illuminating the pixel circuit while the electrode is tied low and while the transfer gate is tied low, thus storing charges in the photodiode, a step of pulsing the transfer gate for transferring charges from the photodiode to the floating diffusion, then reading out the floating diffusion, a step of comparing the result of the pulsing step with the background level, a step of illuminating the pixel circuit while the transfer gate is tied low or intermediate and the electrode is tied high, thus storing charges in the charge storage device and overflowing these to the floating diffusion, and a step of reading out the floating diffusion.

* * * * *